(12) United States Patent
Lee et al.

(10) Patent No.: US 12,369,309 B2
(45) Date of Patent: Jul. 22, 2025

(54) SEMICONDUCTOR DEVICE INCLUDING A SUPPORT LAYER WITH OPENINGS

(71) Applicant: Samsung Electronics Co., Ltd., Suwon-si (KR)

(72) Inventors: Jongmin Lee, Hwaseong-si (KR); Hoonmin Kim, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 437 days.

(21) Appl. No.: 17/726,370

(22) Filed: Apr. 21, 2022

(65) Prior Publication Data

US 2023/0034533 A1     Feb. 2, 2023

(30) Foreign Application Priority Data

Jul. 28, 2021    (KR) .................. 10-2021-0098975

(51) Int. Cl.
| | |
|---|---|
| *H10D 1/68* | (2025.01) |
| *H10B 12/00* | (2023.01) |
| *H10D 1/00* | (2025.01) |

(52) U.S. Cl.
CPC ........... *H10B 12/315* (2023.02); *H10D 1/043* (2025.01); *H10D 1/716* (2025.01);
(Continued)

(58) Field of Classification Search
CPC .... H10B 12/315; H10B 12/033; H10B 12/30; H10B 12/31; H10B 12/318;
(Continued)

(56) References Cited

U.S. PATENT DOCUMENTS

| | | |
|---|---|---|
| 8,343,845 B2 | 1/2013 | Kim et al. |
| 9,159,729 B2 | 10/2015 | Kim et al. |
| | (Continued) | |

FOREIGN PATENT DOCUMENTS

| | | | |
|---|---|---|---|
| CN | 112349719 A | * 2/2021 | ........... G03F 7/0002 |
| KR | 101589912 B1 | 2/2016 | |
| | (Continued) | | |

OTHER PUBLICATIONS

TW Office Action and Search Report dated Dec. 14, 2022 for corresponding Taiwanese Patent Application No. 111116596.
(Continued)

*Primary Examiner* — Ida M Soward
(74) *Attorney, Agent, or Firm* — Harness, Dickey & Pierce, P.L.C.

(57) ABSTRACT

A semiconductor device may include lower electrodes on a substrate, a first upper support layer pattern on upper sidewalls of the lower electrodes, and a dielectric layer and an upper electrode on surfaces of the lower electrodes and the first upper support layer pattern. The lower electrodes may be in a honeycomb pattern with the lower electrodes are at vertexes and center of a hexagon. The first upper support layer pattern may be a first plate shape including openings exposing some of all the lower electrodes. The lower electrodes may form rows in a first direction, the rows arranged in a second direction perpendicular to the first direction. Each opening may expose portions of upper sidewalls of at least four lower electrodes in two adjacent rows. Each of the openings may have a longitudinal direction in the first direction. In semiconductor devices, defects from bending stresses may be decreased.

20 Claims, 17 Drawing Sheets

(52) U.S. Cl.
CPC .......... *H10B 12/0335* (2023.02); *H10B 12/30* (2023.02); *H10B 12/31* (2023.02); *H10B 12/318* (2023.02); *H10D 1/682* (2025.01)

(58) Field of Classification Search
CPC ..... H10B 12/0335; H01L 28/92; H01L 28/55; H10D 1/716; H10D 1/682
See application file for complete search history.

(56) References Cited

U.S. PATENT DOCUMENTS

| | | | | |
|---|---|---|---|---|
| 9,812,461 | B2* | 11/2017 | Doda | H01L 29/66666 |
| 11,056,355 | B2 | 7/2021 | Choi et al. | |
| 2010/0148236 | A1* | 6/2010 | Kadoya | H10D 1/716 |
| | | | | 257/306 |
| 2011/0012184 | A1* | 1/2011 | Yuki | H10B 12/05 |
| | | | | 257/306 |
| 2012/0049380 | A1* | 3/2012 | Kim | H10B 12/033 |
| | | | | 257/773 |
| 2012/0104559 | A1* | 5/2012 | Kim | H10D 1/716 |
| | | | | 257/618 |
| 2012/0161283 | A1* | 6/2012 | Kadoya | H01L 28/90 |
| | | | | 257/532 |
| 2013/0140265 | A1* | 6/2013 | Kim | H01G 4/33 |
| | | | | 216/6 |
| 2015/0041973 | A1* | 2/2015 | Park | H10B 12/315 |
| | | | | 257/737 |
| 2016/0027743 | A1* | 1/2016 | Kakisaki | H10B 12/315 |
| | | | | 257/532 |
| 2018/0019243 | A1* | 1/2018 | Kim | H10B 12/31 |
| 2018/0158827 | A1* | 6/2018 | You | H10B 12/34 |
| 2018/0166542 | A1 | 6/2018 | Kim | |
| 2018/0175041 | A1* | 6/2018 | Kim | H10D 1/714 |
| 2020/0006348 | A1 | 1/2020 | Kim et al. | |
| 2020/0027947 | A1 | 1/2020 | Kwon et al. | |
| 2020/0194437 | A1* | 6/2020 | Song | H01L 21/76838 |
| 2020/0273744 | A1 | 8/2020 | Kim | |
| 2020/0303492 | A1* | 9/2020 | Kim | H10B 12/315 |
| 2021/0043722 | A1* | 2/2021 | Cho | H01L 27/0207 |
| 2021/0066066 | A1 | 3/2021 | Lee et al. | |
| 2021/0082844 | A1 | 3/2021 | Kim et al. | |
| 2022/0084943 | A1* | 3/2022 | Cho | H10B 12/033 |
| 2022/0115376 | A1* | 4/2022 | Kim | H10B 12/033 |

FOREIGN PATENT DOCUMENTS

| | | |
|---|---|---|
| KR | 101944479 B1 | 1/2019 |
| KR | 20200010913 A | 1/2020 |
| KR | 20200039074 A | 4/2020 |
| KR | 20200112218 A | 10/2020 |
| KR | 20210018683 A | 2/2021 |
| KR | 20210027635 A | 3/2021 |
| KR | 20210032844 A | 3/2021 |
| KR | 2021-0063577 A | 6/2021 |

OTHER PUBLICATIONS

Office Action for Korean Application No. 10-2021-0098975 dated Feb. 17, 2025.

* cited by examiner

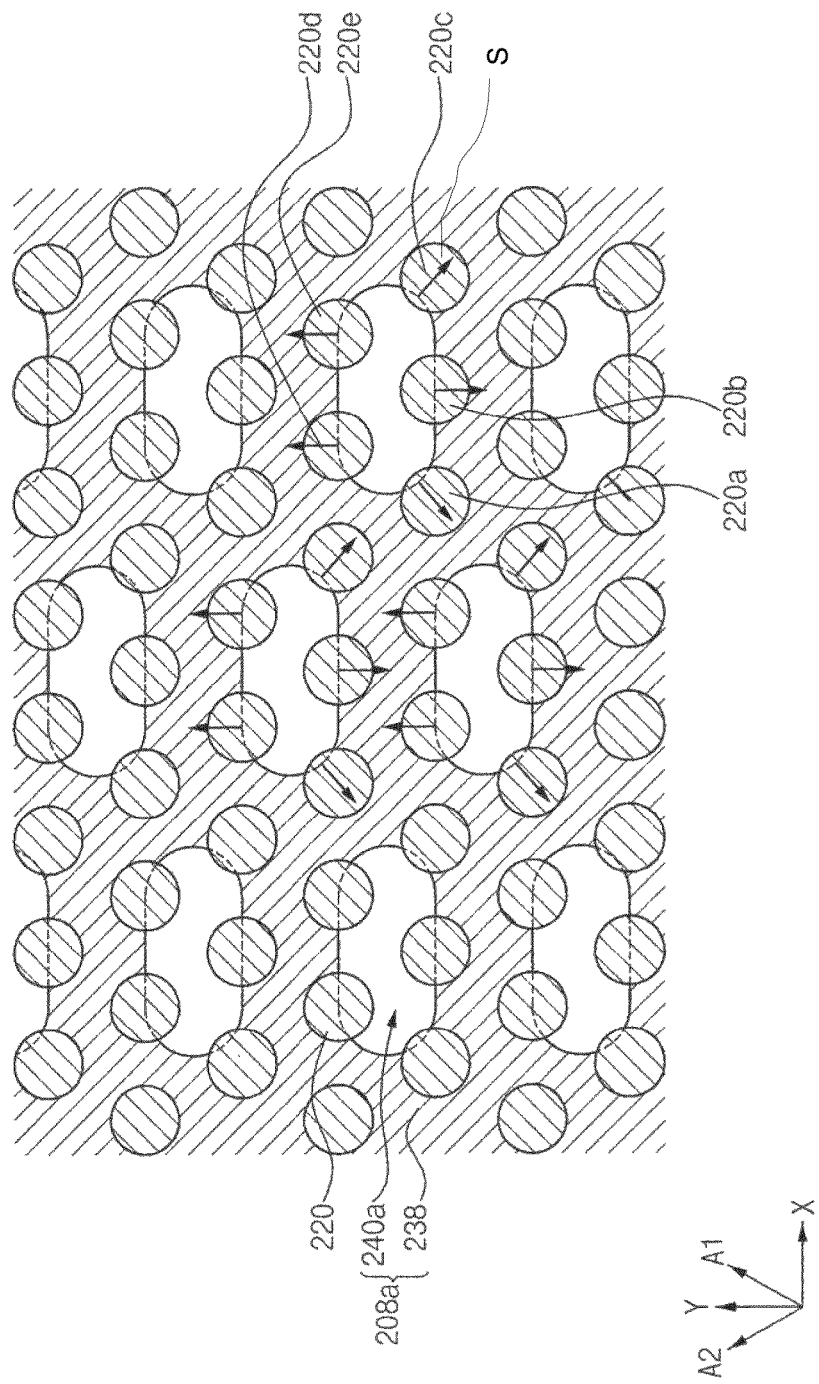

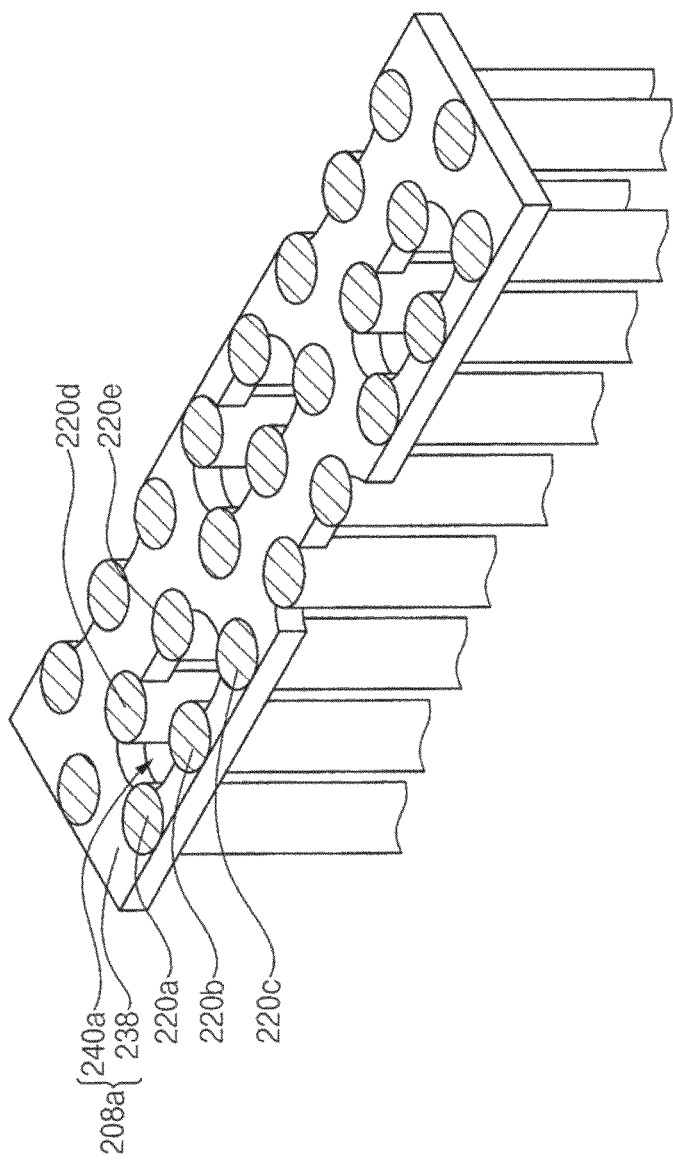

SEMICONDUCTOR DEVICE INCLUDING A SUPPORT LAYER WITH OPENINGS

CROSS-REFERENCE TO RELATED APPLICATION

This application claims priority under 35 USC § 119 to Korean Patent Application No. 10-2021-0098975, filed on Jul. 28, 2021, in the Korean Intellectual Property Office (KIPO), the contents of which are incorporated by reference herein in their entirety.

BACKGROUND

1. Field

Example embodiments relate to a semiconductor device. More particularly, example embodiments relate to DRAM (dynamic random access memory) devices including a capacitor.

2. Description of the Related Art

A capacitor included in a DRAM device may include support layer patterns for supporting lower electrodes. However, stress may be applied to the lower electrode due to the support layer patterns, so that the lower electrode may be bent. Failures of a semiconductor device may be generated due to bending of the lower electrode in the capacitor.

SUMMARY

Example embodiments provide a semiconductor device including a capacitor having a high capacitance and no defect.

According to example embodiments, there is provided a semiconductor device. The semiconductor device may include lower electrodes on a substrate, a first upper support layer pattern on upper sidewalls of the lower electrodes, and a dielectric layer and an upper electrode on surfaces of the lower electrodes and the first upper support layer pattern. The lower electrodes may be arranged in a honeycomb pattern such that the lower electrodes are at each vertex of a hexagon and a center of the hexagon. The first upper support layer pattern may be between the lower electrodes. The first upper support layer pattern may be a first plate shape including openings exposing a portion of all the lower electrodes. The lower electrodes may form rows in a first direction. The rows may be arranged in a second direction perpendicular to the first direction. Each of the openings may expose portions of upper sidewalls of at least four lower electrodes in two adjacent rows in the second direction. In a plan view, each of the openings may have a longitudinal direction in the first direction.

According to example embodiments, there is provided a semiconductor device. The semiconductor device may include a cell lower structure on a substrate, lower electrodes, a first upper support layer pattern, a dielectric layer and an upper electrode. The cell lower structure may include bit line structures, contact plugs and landing pads, a first upper support layer pattern. The lower electrodes may contact on the landing pads, respectively. The lower electrodes may be arranged in a honeycomb pattern such that the lower electrodes are at each vertex of a hexagon and a center of the hexagon. The first upper support layer pattern may be on upper sidewalls of the lower electrodes. The first upper support layer pattern may be between the lower electrodes. The first upper support layer pattern may have a first plate shape including openings exposing a portion of all the lower electrodes. The dielectric layer and the upper electrode may be formed on surfaces of the lower electrodes and the first upper support layer pattern. The lower electrodes may form rows in a first direction. The rows may be arranged in a second direction perpendicular to the first direction. Each of the openings may expose portions of upper sidewalls of at least four lower electrodes in two adjacent rows in the second direction. A direction of a bending stress applied to each of the lower electrodes may be not parallel with an imaginary boundary of an open portion at an overlapping portion of the lower electrode and the opening. The opening may be such that directions of the bending stresses of neighboring lower electrodes do not face each other.

According to example embodiments, there is provided a semiconductor device. The semiconductor device may include a cell lower structure on a substrate, lower electrodes, a first upper support layer pattern and a dielectric layer and an upper electrode. The cell lower structure may include bit line structures, contact plugs and landing pads. The lower electrodes may contact on the landing pads, respectively. The lower electrodes may be arranged in a honeycomb pattern such that the lower electrodes are arranged at each vertex of a hexagon and a center of the hexagon. The first upper support layer pattern may be on upper sidewalls of the lower electrodes. The first upper support layer pattern may be between the lower electrodes. The first upper support layer pattern may have a first plate shape including openings exposing a portion of all the lower electrodes. The dielectric layer and the upper electrode may be formed on surfaces of the lower electrodes and the first upper support layer pattern. The lower electrodes may form rows in a first direction. The rows may be arranged in a second direction perpendicular to the first direction. Each of the openings may expose portions of upper sidewalls of at least four lower electrodes in two adjacent rows in the second direction. In a plan view, each of the openings may have a longitudinal direction in the first direction. Neighboring openings may be not arranged in parallel in the first direction, and the neighboring openings may be arranged in parallel in the second direction.

In the cell capacitor of the semiconductor device in accordance with example embodiments, the bending stress may not occur in a direction in which adjacent lower electrodes face each other. Thus, defects due to bending stress of the lower electrodes may be decreased.

BRIEF DESCRIPTION OF THE DRAWINGS

Example embodiments will be more clearly understood from the following detailed description taken in conjunction with the accompanying drawings. FIGS. 1 to 17 represent non-limiting, example embodiments as described herein.

FIG. 1 is a plan view illustrating a layout of a DRAM device in accordance with example embodiments;

FIG. 2 is a cross-sectional view of a DRAM device in accordance with example embodiments;

FIG. 3 is a plan view illustrating cell capacitors of a DRAM device in accordance with example embodiments;

FIG. 4 is a perspective view illustrating a portion of cell capacitors of a DRAM device in accordance with example embodiments;

FIG. 6 is a plan view illustrating cell capacitors of a DRAM device in accordance with example embodiments;

FIG. 7 is a plan view illustrating cell capacitors of a DRAM device in accordance with some example embodiments;

FIG. 8 is a plan view illustrating cell capacitors of a DRAM device in accordance with example embodiments;

FIG. 9 is a plan view illustrating cell capacitors of a DRAM device in accordance with example embodiments;

FIG. 10 is a plan view illustrating cell capacitors of a DRAM device in accordance with example embodiments; and FIGS. 11 to 17 are cross-sectional views illustrating a method of manufacturing a semiconductor device in accordance with example embodiments.

DESCRIPTION OF EMBODIMENTS

Figure 1:
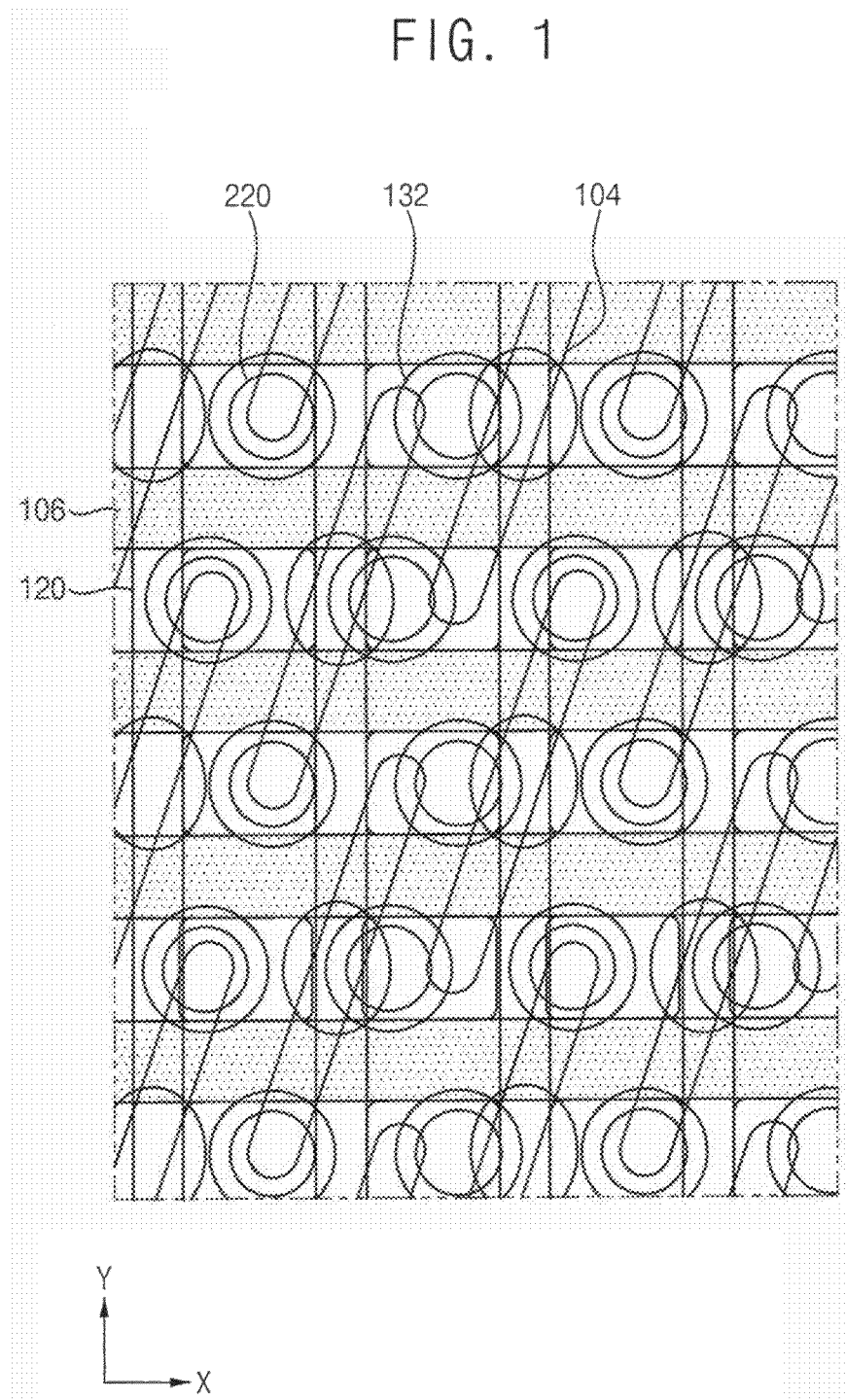
Figure 2:
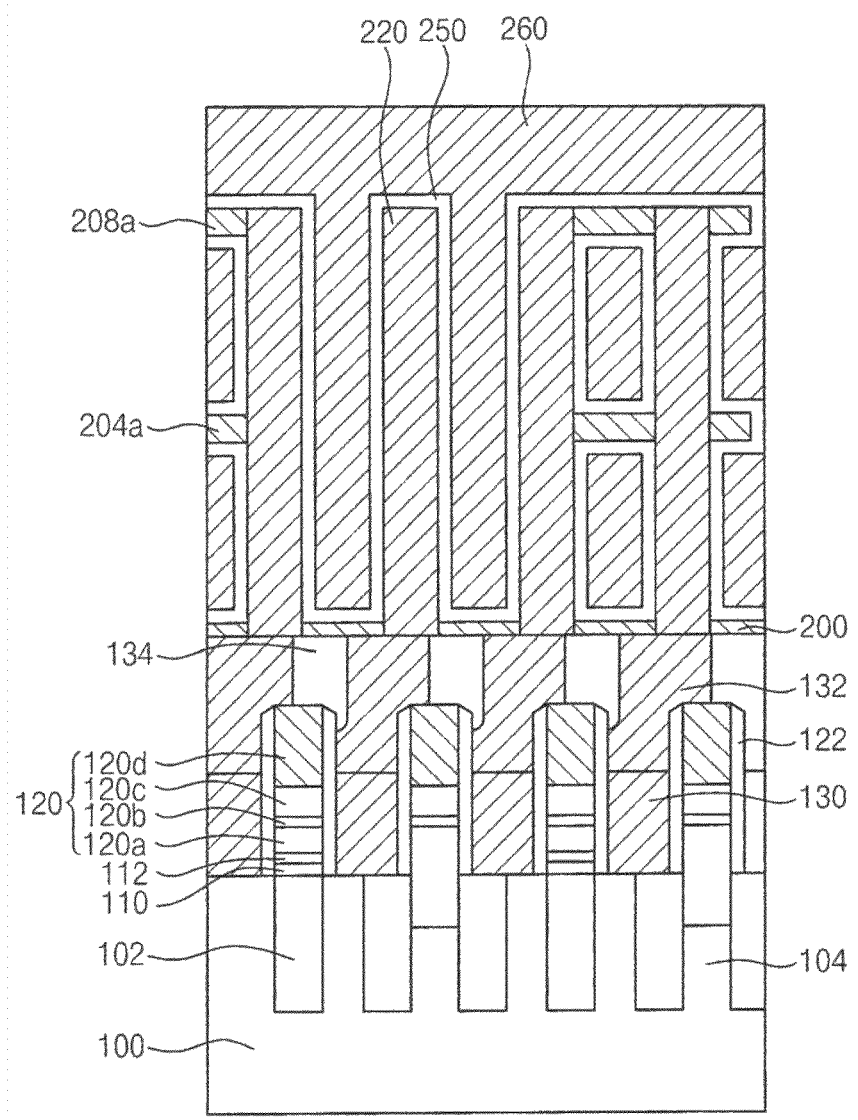

FIG. 1 is a plan view illustrating a layout of a DRAM device in accordance with example embodiments. FIG. 2 is a cross-sectional view of a DRAM device in accordance with example embodiments. FIG. 3 is a plan view illustrating cell capacitors of a DRAM device in accordance with example embodiments. FIG. 4 is a perspective view illustrating a portion of cell capacitors of a DRAM device in accordance with example embodiments In order to avoid complication of the drawings, a structure formed on a lower electrode of the cell capacitor is not shown in FIG. 1. FIGS. 3 and 4 show arrangements of lower electrodes and a first upper support layer pattern of the cell capacitors. Hereinafter, an arrow S in each of plan views indicates a direction of a bending stress.

Referring to FIGS. 1 to 4, a DRAM device may be formed on a substrate 100.

The substrate 100 may be a wafer including silicon, germanium, silicon-germanium, and/or a III-V compound such as GaP, GaAs, and/or GaSb. In some example embodiments, the substrate 100 may be a silicon-on-insulator (SOI) wafer or a germanium-on-insulator (GOI) wafer.

The DRAM device may include selection transistors, cell capacitors, and a bit line structure 120. A unit memory cell of the DRAM device may include one selection transistor and one cell capacitor.

An isolation layer 102 may be formed at the substrate 100. The substrate 100 between the isolation layers 102 may be defined as an active region 104.

A gate trench extending in a first direction X parallel to an upper surface of the substrate 100 may be formed at the substrate 100. A gate structure 106 may be formed in the gate trench, and may extend in the first direction X.

In example embodiments, the gate structure 106 may include a gate insulation layer, a gate electrode, and a capping insulation pattern. A plurality of the gate structures 106 may be arranged in a second direction Y parallel to the upper surface of the substrate 100 and perpendicular to the first direction X.

First and second impurity regions serving as source/drain regions may be formed at the active region 104 between the gate structures 106. The gate structure 106 and the first and second impurity regions may serve as the selection transistor.

A pad insulation pattern 110 and a first etch stop layer pattern 112 may be formed on the active region 104, the isolation layer 102, and the gate structure 106. For example, the pad insulation pattern 110 may include an oxide such as silicon oxide, and the first etch stop layer pattern 112 may include a nitride such as silicon nitride.

A recess may be included in a portion of the substrate 100 on which the pad insulation pattern 110 and the first etch stop layer pattern 112 are not formed. An upper surface of the first impurity region may be exposed on a bottom of the recess.

A bit line structure 120 may be formed on the first etch stop layer pattern 112 and the recess. The bit line structure 120 may include a conductive pattern 120a, a barrier metal pattern 120b, a metal pattern 120c, and a hard mask pattern 120d stacked. The conductive pattern 120a may include, e.g., polysilicon doped with impurities. The bit line structure 120 may extend in the second direction. A plurality of bit line structures may be arranged in the first direction to be spaced from each other. In example embodiments, a spacer 122 may be formed on a sidewall of the bit line structure 120.

A first insulating interlayer (not shown) may fill a space between the bit line structures.

A stacked structure including a contact plug 130 and a landing pad 132 may be formed through the first insulating interlayer, the first etch stop layer pattern 112, and the pad insulation pattern 110, and the contact plug 130 may contact the second impurity region. The contact plug 130 may be disposed between the bit line structures 120. The landing pad 132 may be formed on the contact plug 130. An insulation pattern 134 may be formed between the landing pads 132.

A second etch stop layer 200 may be formed on the landing pad 132, the insulation pattern 134, and the first insulating interlayer. A cell capacitor may contact the landing pad 132 through the second etch stop layer 200.

The second etch stop layer 200 may include, e.g., silicon nitride, silicon oxynitride, and/or the like. The cell capacitor may include a lower electrode 220, a dielectric layer 250, an upper electrode 260, a first lower support layer pattern 204a, and a first upper support layer pattern 208a.

The lower electrode 220 may pass through the second etch stop layer 200, and the lower electrode 220 may contact the landing pad 132.

A plurality of lower electrodes 220 may be formed on the landing pads 132, respectively. The lower electrodes 220 may be arranged in a honeycomb structure, which is disposed at each vertex of a connected hexagon and a center of the hexagon.

Hereinafter, an arrangement in the first direction is referred to as a row. The lower electrodes 220 may form the row along the first direction X, and a plurality of rows may be disposed in the second direction Y.

The lower electrodes 220 arranged in odd-numbered rows may be spaced apart from each other by the same distance, and the lower electrodes 220 arranged in even-numbered rows may be spaced apart from each other by the same distance. The lower electrodes 220 arranged in the even-numbered rows may not be disposed in parallel to the lower electrodes 220 arranged in the odd-numbered rows in the second direction Y. Each of the lower electrodes 220 arranged in even-numbered rows may be disposed to be aligned to a portion between the lower electrodes 220 arranged in the odd-numbered rows. That is, the lower electrodes 220 arranged in the odd-numbered rows and the lower electrodes 220 and the lower electrodes 220 arranged in the even-numbered rows may be arranged in a zig-zag fashion in the second direction Y.

In the arrangement of the lower electrodes 220, six neighboring lower electrodes may be positioned around one lower electrode 220. In around the one lower electrode 220, two neighboring lower electrodes in the first direction X, two neighboring lower electrodes in a first oblique direction A1, and two neighboring lower electrodes in a second oblique direction A2 may be disposed. The first oblique direction A1 may be a direction having an angle of 60 degrees to the first direction X, and the second oblique direction Z2 may be a direction having an angle of 120 degrees to the first direction X.

For example, a distance between centers of neighboring lower electrodes 220 in the first direction X may be 3.0 F. Each of a distance between centers of neighboring lower electrodes 220 in the first oblique direction A1 and a distance between centers of neighboring lower electrodes 220 in the second oblique direction A2 may be 2.6 F. Here, the F means a minimum lithographic feature size.

In example embodiments, the lower electrodes 220 may have a filled cylindrical shape, that is, a pillar shape. In some example embodiments, the lower electrodes may have a hollow cylindrical shape.

In example embodiments, the lower electrode 220 may include a metal such as Ti, W, Ni, and/or Co or a metal nitride such as TiN, TiSiN, TiAlN, TaN, TaSiN, and/or WN. For example, the lower electrode 220 may include TiN.

Each of the first lower support layer pattern 204a and the first upper support layer pattern 208a may be disposed between the lower electrodes 220. Each of the first lower support layer pattern 204a and the first upper support layer pattern 208a may be connected to the lower electrodes 220, and thus each of the first lower support layer pattern 204a and the first upper support layer pattern 208a may support the lower electrodes 220. The first lower support layer pattern 204a and the first upper support layer pattern 208a may include an insulation material, e.g., silicon nitride or silicon oxynitride.

The first upper support layer pattern 208a may be formed to support upper portions of the lower electrodes 220 to each other. The first upper support layer pattern 208a may be connected upper sidewalls of the lower electrodes 220. An upper surface of the first upper support layer pattern 208a may be coplanar with an upper surface of the lower electrode 220.

The first upper support layer pattern 208a may be positioned between the lower electrodes 220, and the first upper support layer pattern 208a may contact at least upper outer walls of all of the lower electrodes 220.

The first upper support layer pattern 208a may be a first upper plate 238 having first openings 240a. The first upper plate 238 may be formed between upper portions of the first lower electrodes 220. The first openings 240a may be arranged to have a predetermined pattern. Upper sidewalls of the plurality of first lower electrodes 220 may be partially exposed by the first openings 240a.

Hereinafter, an open portion of the first opening 240a is a portion facing an exposed portion of an etch mask pattern for forming the first opening 240a. That is, the open portion of the first opening 240a may include a portion corresponding to the first opening 240a and an overlapping portion of the lower electrode 220 and the first opening 240a.

One sidewall of the lower electrode 220 may contact the first upper support layer pattern 208a in a portion where the first opening 240a is not formed. In addition, one sidewall of the lower electrode 220 may be exposed by the first opening 240a. That is, in each of the lower electrodes 220, a portion contacting the first upper support layer pattern 208a and a portion not contacting the first upper support layer pattern 208a may be included. Only a surface of the lower electrode 220 of a portion not contacting the first upper support layer pattern 208a may be oxidized. Thus, the lower electrode of the portion contacting the first upper support layer pattern 208a and the lower electrode of the portion not contacting the first upper support layer pattern 208a may have different stresses caused by the oxidation. The lower electrode 220 may be bent in a direction in which the stress is generated. Therefore, a bending defect of the lower electrode 220 may occur due to the stress.

Figure 5A:
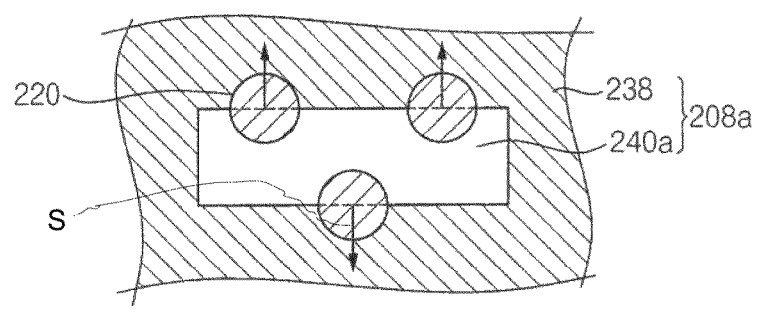
FIGS. 5A and 5B are plan views for explaining a direction of bending stress according to a position of a first opening.
Figure 5B:
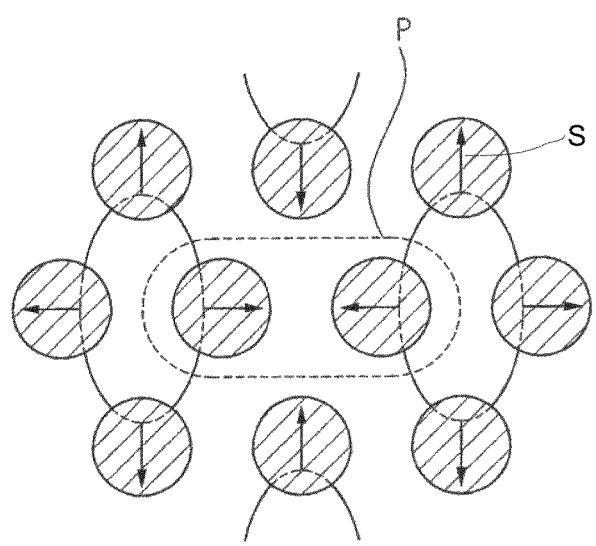

FIGS. 5A and 5B are plan views for explaining a direction of bending stress according to a position of a first opening.

FIG. 5B is a plan view illustrating an example of a first upper support layer pattern including a first opening having a structure in which bending stress is generated in a direction in which neighboring lower electrodes are faced to each other.

Referring to FIGS. 5A and 5B, the direction of the bending stress applied to the lower electrode 220 may be a vertical direction (e.g., horizontal in a plan view, an arrow direction) from an imaginary boundary of the open portion at the overlapping portion of the lower electrode 220 and the first opening 240a. That is, the direction of the bending stress may not be parallel to the imaginary boundary, for example, the directions of the bending stresses may be perpendicular or substantially perpendicular to the imaginary boundary. Also, the direction of the bending stress applied to the lower electrode 220 may be a direction from the imaginary boundary of the open portion toward the first upper plate 238.

In this case, the direction of the bending stress applied to the lower electrode 220 may be controlled by adjusting positions and shapes of the first openings 240a included in the first upper support layer pattern 208a.

As shown in FIG. 5B, the lower electrodes 220 adjacent in the first direction may have bending stresses in the directions facing to each other in the first direction (refer to part P). In this case, each of the lower electrodes 220 may be bent by the bending stress, so that a bridge defect of the lower electrodes 220 in which the lower electrodes 220 adjacent to the first direction contact each other may occur.

The first openings 240a may be disposed so that directions of the bending stresses of neighboring lower electrodes do not face each other. In example embodiments, the first openings 240a may be positioned so that the bending stresses in the directions facing to each other may not be generated in two neighboring lower electrodes adjacent in the first direction, two neighboring lower electrodes in the first oblique direction, and two neighboring lower electrodes in the second oblique direction.

In example embodiments, one first opening 240a may partially expose upper sidewalls of the plurality of lower electrodes 220 disposed in two rows in the second direction Y.

One first opening 240a may partially expose upper sidewalls of four or more lower electrodes 220. Since one first opening 240a partially exposes four or more lower electrodes 220, a size of the opening portion of the first openings 240a may be increased. Thus, first opening 240a may be easily patterned.

In example embodiments, neighboring first openings 240a may be disposed not to be parallel in the first direction X. The neighboring first openings 240a may be disposed to be parallel in the second direction Y.

In example embodiments, in the plan view, a longitudinal direction of the first opening 240a may be the first direction X.

In example embodiments, five or more odd number of lower electrodes may be partially exposed by one first opening 240a. In the plan view, one first opening 240a may partially expose n (n is 3 or more) lower electrodes 220 in a first row and n−1 lower electrodes in a second row adjacent to the first row. Directions of bending stresses of the n−1 lower electrodes 220 in the second row exposed by the one first opening 240a may be parallel to the second direction.

For example, as shown in FIGS. 3 and 4, the first opening 240a may have an elliptical shape in which the first direction X is a longitudinal direction. Five lower electrodes 220 in two adjacent rows may be exposed by one first opening 240a. The five lower electrodes are denoted by reference numerals 220a to 220e, respectively.

In the plan view, one first opening 240a may partially expose three lower electrodes 220a, 220b, and 220c in a first row and two lower electrodes 220d and 220e in a second row adjacent to the first row. A first opening 240a adjacent to the one first opening 240a in the first oblique direction or a first opening 240a adjacent to the one first opening 240a in the second oblique direction may partially expose three lower electrodes 220a, 220b, and 220c in the second row and two lower electrodes 220d and 220e in a third row adjacent to the second row.

In FIG. 3, the direction of the bending stress applied to each of the lower electrodes is indicated by an arrow.

Referring to FIG. 3, the directions of the bending stresses of two lower electrodes 220d and 220e in a row exposed by one first opening 240a may be parallel to the second direction. The directions of the bending stresses of two electrodes positioned at both ends among three lower electrodes 220a, 220b and 220c in a row exposed by one first opening 240a may be a different direction from the second direction Y.

Bending stresses in opposite directions aligned in a line may not be generated in the two neighboring lower electrodes in the first direction X, the two neighboring lower electrodes in the first oblique direction, and the two neighboring lower electrodes in the second oblique direction. Directions of the bending stresses applied to the lower electrodes 220 adjacent to each other may not be faced to each other, and may distributed. A bridge defect of the lower electrodes 220 caused by bending of the lower electrodes 220 may be decreased.

The first lower support layer pattern 204a may be formed to support a center portions of the lower electrodes 220 in a vertical direction to each other. The first lower support layer pattern 204a may be positioned under the first upper support layer pattern 208a.

In the plan view, the first lower support layer pattern 204a may have the same shape as the first upper support layer pattern 208a. The first lower support layer pattern 204a may be positioned in the center portion of the lower electrodes 220. The first lower support layer pattern 204a may be a first lower plate having second openings. The first lower plate may be formed between center portions of the first lower electrodes 220. The second openings may be arranged to have a predetermined pattern. The second openings may be disposed at the same position as the first openings 240a, and the first and second openings may be faced to each other in the vertical direction. Thus, the second openings included in the first lower support layer pattern 204a may expose at least a portion of all lower electrodes 220 in cell capacitors.

As the first lower support layer pattern 204a and the first upper support layer pattern 208a are formed, the lower electrodes 220 may be stably supported.

In some example embodiments, although not illustrated, the first lower support layer pattern may not be formed. In some example embodiments, two or more first lower support layer patterns may be formed under the first upper support layer pattern 208a.

The dielectric layer 250 may be conformally formed on the surfaces of the lower electrode 220, the first lower support layer pattern 204a, the first upper support layer pattern 208a, and the second etch stop layer 200. The dielectric layer 250 may include a metal oxide such as HfO2, ZrO2, Al2O3, La2O3, Ta2O3 and TiO2, a perovskite dielectric material such as SrTiO3 (STO), BaTiO3, PZT, PLZT, or combinations thereof.

The upper electrode 260 may be disposed on the dielectric layer 250. Thus, the dielectric layer 250 may be positioned between the lower electrode 220 and the upper electrode 260. The upper electrode 260 may include a metal such as Ti, W, Ni, and/or Co or a metal nitride such as TiN, TiSiN, TiAlN, TaN, TaSiN, and/or WN. For example, the upper electrode 260 may include TiN.

As described above, defects caused by bending of the lower electrodes may be decreased by controlling the shape and the position of the first openings 240a included in the first upper support layer pattern 208a.

Hereinafter, various shapes of the first lower support layer pattern and the first upper support layer pattern used in the cell capacitor are presented. Hereinafter, in the cell capacitor, an arrangement and shape of the first upper support layer pattern are only described. However, the cell capacitor may further include a first lower support layer pattern having the same arrangement and shape as the first upper support layer pattern.

Figure 6:
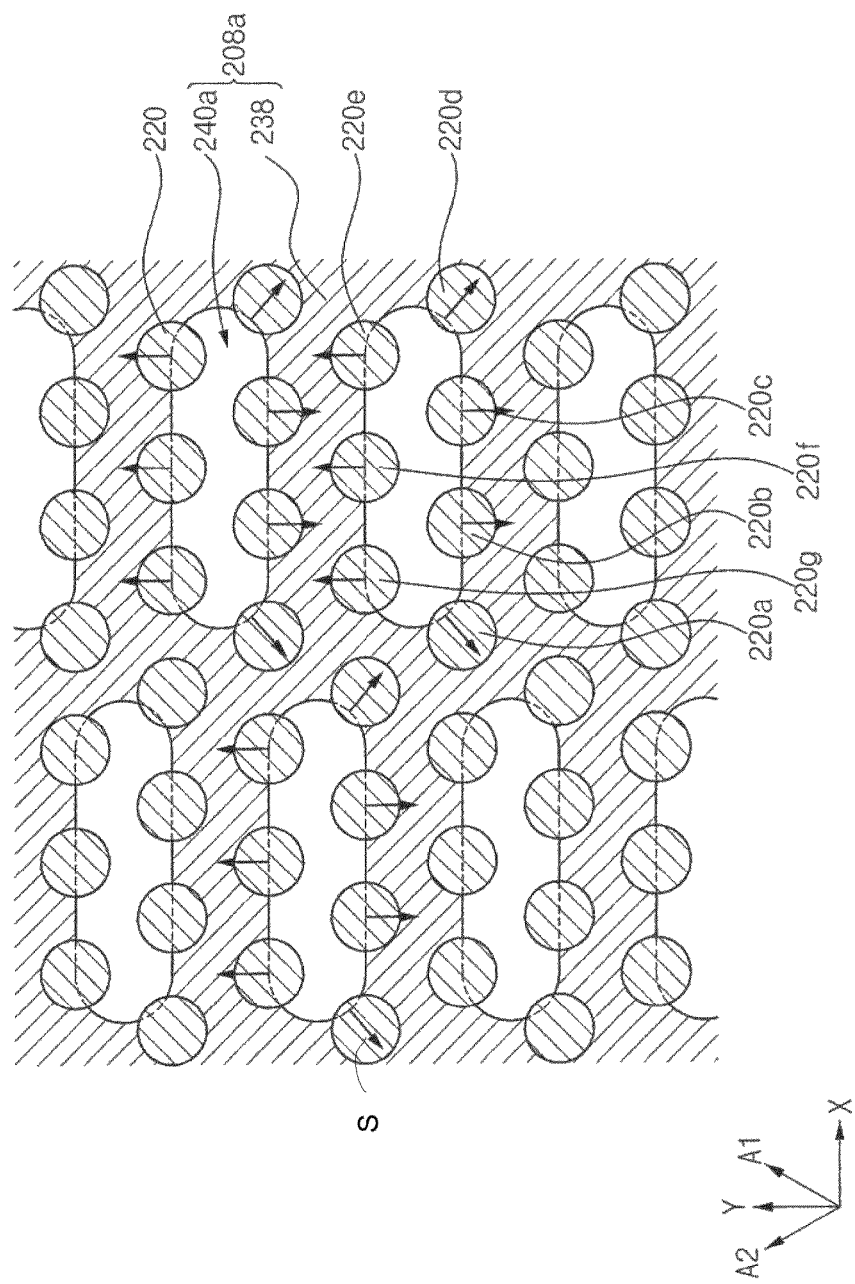
Figure 7:
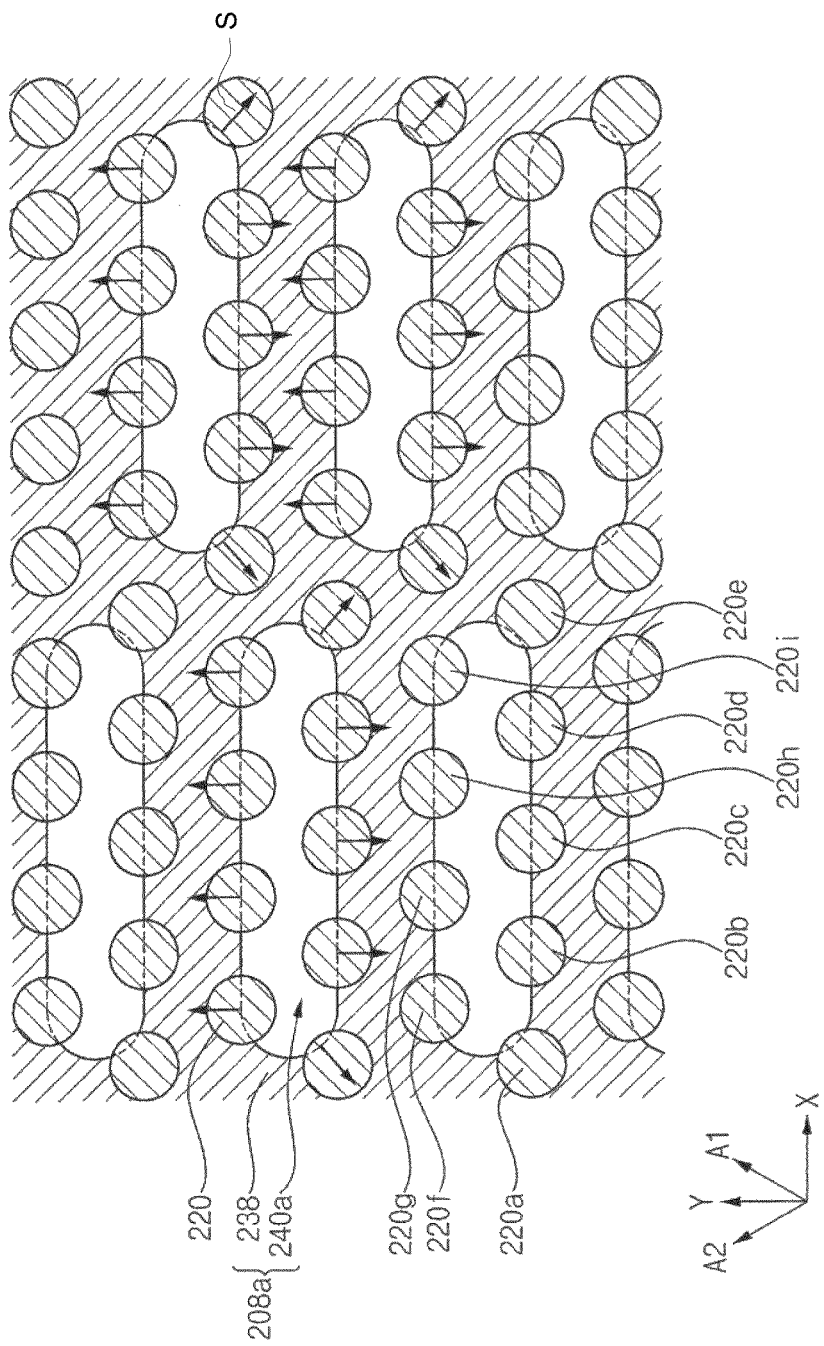

FIG. 6 is a plan view illustrating cell capacitors of a DRAM device in accordance with example embodiments.
FIG. 7 is a plan view illustrating cell capacitors of a DRAM device in accordance with some example embodiments.

FIGS. 6 and 7 show arrangements of the lower electrodes and the first upper support layer pattern in the cell capacitor. FIGS. 6 and 7, one first opening may partially expose seven or more odd number of lower electrodes.

FIGS. 6 and 7, the lower electrodes 220 may be disposed in the honeycomb structure.

The first upper support layer pattern 208a is substantially the same as the first upper support layer pattern shown in FIG. 3, except for the number of lower electrodes 220 exposed by the first opening 240a. The first opening 240a may have an elliptical shape in which the first direction X is a longitudinal direction.

As shown in FIG. 6, one first opening 240a may expose seven lower electrodes 220 in two adjacent rows. The seven lower electrodes are denoted by reference numerals 220a to 220g, respectively.

In the plan view, one first opening 240a may partially expose four lower electrodes 220a, 220b, 220c, and 220d in a first row and three lower electrodes 220e in a second row adjacent to the first row 220f and 220g. A first opening 240a adjacent to the one first opening 240a in the first oblique direction A1 or a first opening 240a adjacent to the one first opening 240a in the second oblique direction A2 may partially expose four lower electrodes in the second row and three lower electrodes in the third row adjacent to the second row.

As shown in FIG. 7, one first opening 240a may expose nine lower electrodes 220 in two adjacent columns. The nine lower electrodes are denoted by reference numerals 220a to 220i, respectively.

In the plan view, one first opening 240a may partially expose five lower electrodes 220a, 220b, 220c, 220d, and 220e in the first row and four lower electrodes 220f, 220g, 220h, and 220i in the second row adjacent to the first row. A first opening 240a adjacent to the one first opening 240a in the first oblique direction A1 or a first opening 240a adjacent to the one first opening 240a in the second oblique direction A2 may partially expose five lower electrodes in the second row and four lower electrodes in a third row adjacent to the second row.

In FIGS. 6 and 7, a direction of the bending stress applied to each of the lower electrodes 220 is indicated by an arrow.

Bending stresses in opposite directions aligned in a line may not be generated in two neighboring lower electrodes in the first direction X, two neighboring lower electrodes in the first oblique direction A1, and two neighboring lower electrodes in the second oblique direction A2. Directions of the bending stresses applied to the lower electrodes 220 adjacent to each other may not be faced to each other, and may distributed. A bridge defect of the lower electrodes 220 caused by bending of the lower electrodes 220 may be decreased.

Figure 8:
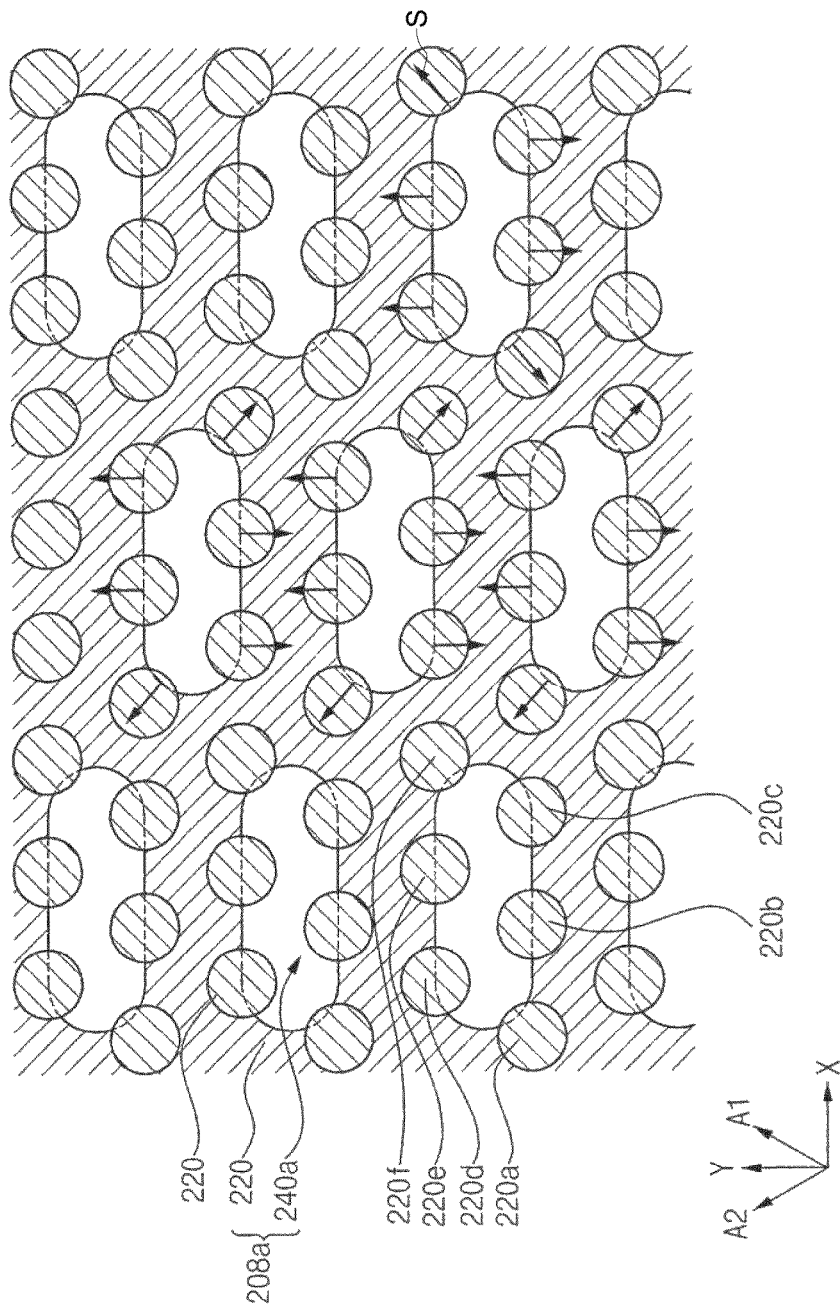

FIG. 8 is a plan view illustrating cell capacitors of a DRAM device in accordance with example embodiments.

FIG. 8 shows arrangements of the lower electrodes and the first upper support layer pattern in the cell capacitor.

Referring to FIG. 8, the lower electrodes 220 may be disposed in the honeycomb structure.

In example embodiments, neighboring first openings 240a may be disposed not to be parallel in the first direction X. The neighboring first openings 240a may be disposed to be parallel in the second direction Y.

In example embodiments, in the plan view, a longitudinal direction of the first opening 240a may be the first direction X.

In example embodiments, one first opening 240a may partially expose four or more even-numbered lower electrodes 220. In a plan view, one first opening 240a may expose the same number of lower electrodes 220 in each of the first row and in the second row adjacent to the first row. Directions of bending stresses of one of the lower electrodes 220 of the first row and one of the lower electrodes 220 of the second row may be different from the second direction.

For example, as shown in FIG. 8, the first opening 240a may have an elliptical shape in which the first direction X is a longitudinal direction. Six lower electrodes 220 in two adjacent rows may be exposed by one first opening 240a. The six lower electrodes are denoted by reference numerals 220a to 220f, respectively.

In the plan view, the same number of lower electrodes 220 in each row may be exposed by one first opening 240a. The one first opening 240a may expose three lower electrodes 220a, 220b, and 220c in a first row and three lower electrodes 220d, 220e, 220f in a second row adjacent to the first row. A first opening 240a adjacent to the one first opening 240a in the first oblique direction or a first opening 240a adjacent to the one first opening 240a in the second oblique direction may partially expose three lower electrodes in the second row and three lower electrodes in a third row adjacent to the second row.

The direction of the bending stress of the lower electrode positioned at one of ends among lower electrodes in a row exposed by one first opening 240a may be a different direction from the second direction Y. The directions of the bending stresses of the other lower electrodes positioned in each row exposed by the one first opening 240a may be parallel to the second direction.

In FIG. 8, the direction of the bending stress applied to the lower electrodes is indicated by an arrow.

Referring to FIG. 8, the bending stresses in opposite directions aligned in a line may not be generated in two neighboring lower electrodes in the first direction X, two neighboring lower electrodes in the first oblique direction A1, and two neighboring lower electrodes in the second oblique direction A2. Directions of the bending stresses applied to the lower electrodes 220 adjacent to each other may not be faced to each other, and may be distributed. Thus, a bridge defect of the lower electrodes caused by bending of the lower electrodes may be decreased.

Figure 9:
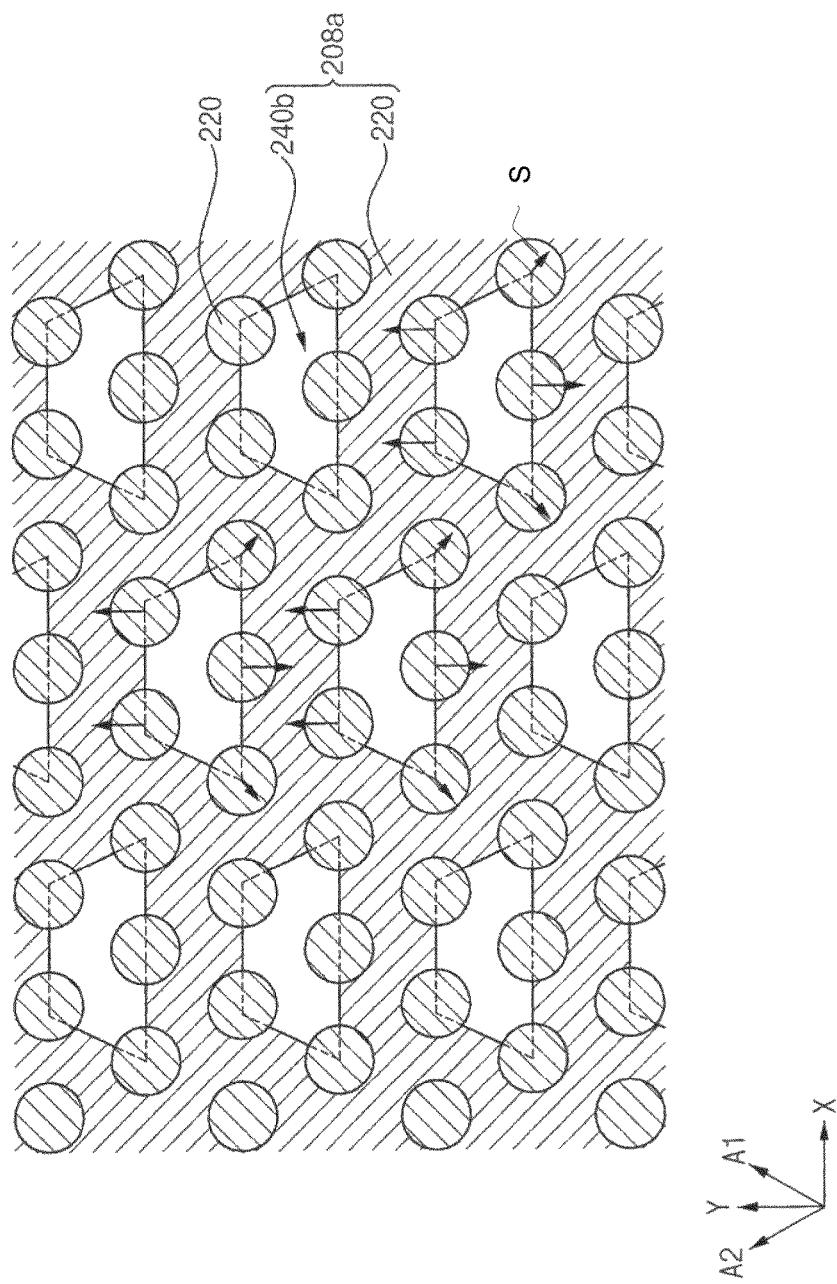

FIG. 9 is a plan view illustrating cell capacitors of a DRAM device in accordance with example embodiments.

FIG. 9 shows arrangements of the lower electrodes and the first upper support layer pattern in the cell capacitor.

Referring to FIG. 9, the lower electrodes 220 may be disposed in the honeycomb structure.

The first upper support layer pattern 208a may be substantially the same as the first upper support layer pattern shown in FIG. 3, except for a shape of the first opening.

As shown in FIG. 9, one first opening 240b may expose a portion of upper sidewalls of the plurality of lower electrodes 220 in two rows in the second direction Y.

The first opening 240b may have a trapezoidal shape, in the plan view. A longitudinal direction of the first opening 240b may be the first direction X. For example, the edge boundaries of the first opening 240b may be linear or straight.

In example embodiments, one first opening 240b may expose five lower electrodes 220 arranged in two rows. In some example embodiments, one first opening 240b may expose four, six or more lower electrodes 220 arranged in two rows.

Figure 10:
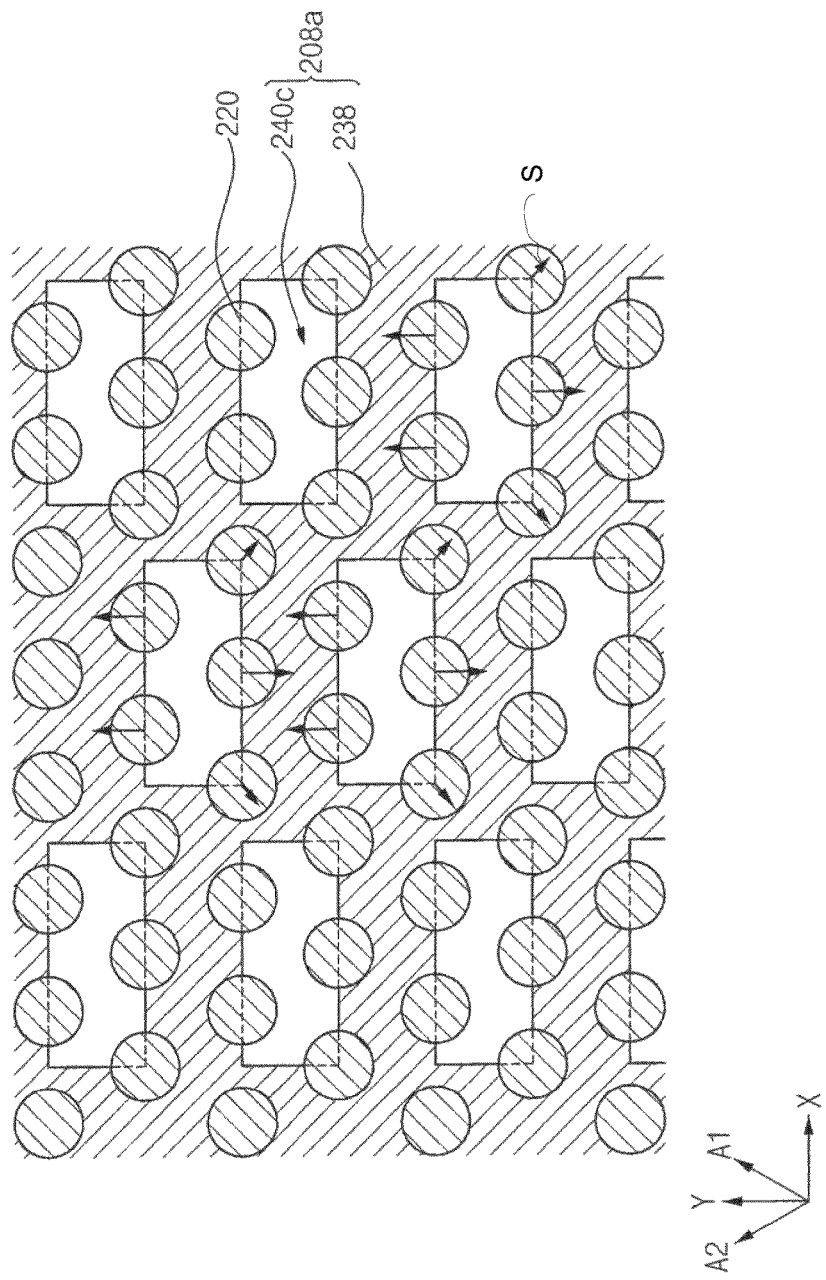

FIG. 10 is a plan view illustrating cell capacitors of a DRAM device in accordance with example embodiments.

FIG. 10 shows arrangements of the lower electrodes and the first upper support layer pattern in the cell capacitor.

Referring to FIG. 10, the lower electrodes 220 may be disposed in the honeycomb structure.

The first upper support layer pattern 208a may be substantially the same as the first upper support layer pattern shown in FIG. 3, except for a shape of the first opening.

As shown in FIG. 10, one first opening 240c may expose a portion of upper sidewalls of the plurality of lower electrodes 220 in two rows in the second direction.

The first opening 240c may have a rectangular shape, in the plan view. A longitudinal direction of the first opening 240c may be the first direction X. For example, the edge boundaries of the first opening 240c may be linear or straight.

In example embodiments, one first opening 240c may expose five lower electrodes 220 arranged in two rows. In some example embodiments, one first opening 240c may expose four, six or more lower electrodes 220 arranged in two rows.

FIGS. 11 to 17 are cross-sectional views illustrating a method of manufacturing a semiconductor device in accordance with example embodiments.

Figure 11:
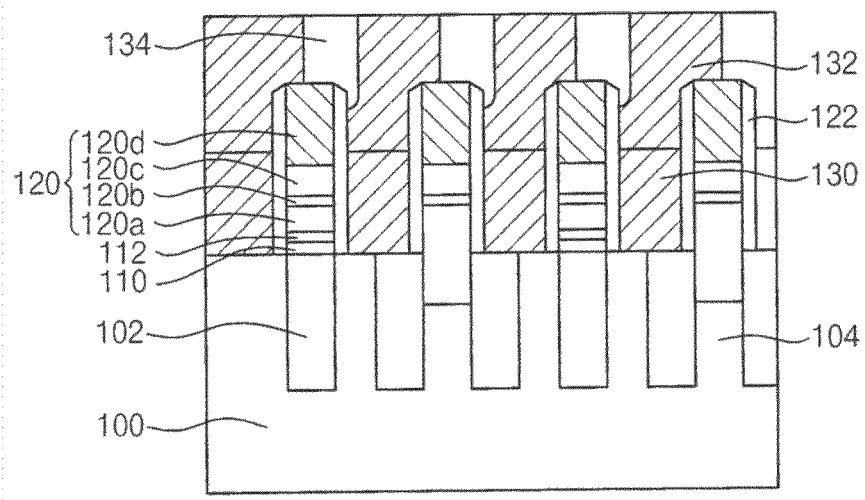

Referring to FIG. 11, an isolation layer 102 may be formed by performing a shallow trench isolation (STI) process on the substrate 100. The substrate 100 may be divided into an isolation region in which the isolation layer 102 is formed and an active region 104 between isolation regions.

Upper portions of the substrate 100 and the isolation layer 102 may be etched to form a gate trench (not shown) extending in the first direction. A gate structure (not shown) may be formed in the gate trench. First and second impurity regions may be formed at active regions adjacent to both sides of the gate structure.

A pad insulation pattern 110 and a first etch stop layer pattern 112 may be formed on the active region, the isolation layer 102, and the gate structure. Recess may be formed at the substrate on which the pad insulation pattern 110 and the first etch stop layer pattern 112 are not formed. An upper surface of the first impurity region may be exposed on a bottom of the recess.

A bit line structure 120 extending in the second direction may be formed on the first etch stop layer pattern 112 and the recess. The bit line structure 120 may have a stacked structure including a conductive pattern 120a, a barrier metal pattern 120b, a metal pattern 120c, and a hard mask pattern 120d. In example embodiments, a spacer 122 may be formed on a sidewall of the bit line structure 120.

A first insulating interlayer (not shown) may be formed to cover the bit line structures 120.

The first insulating interlayer between the bit line structures 120 may be etched to form a contact hole exposing the second impurity region of the substrate. A contact plug 130 and a landing pad 132 are formed to fill the contact hole. An insulation pattern 134 may be formed between the landing pads 132.

Figure 12:
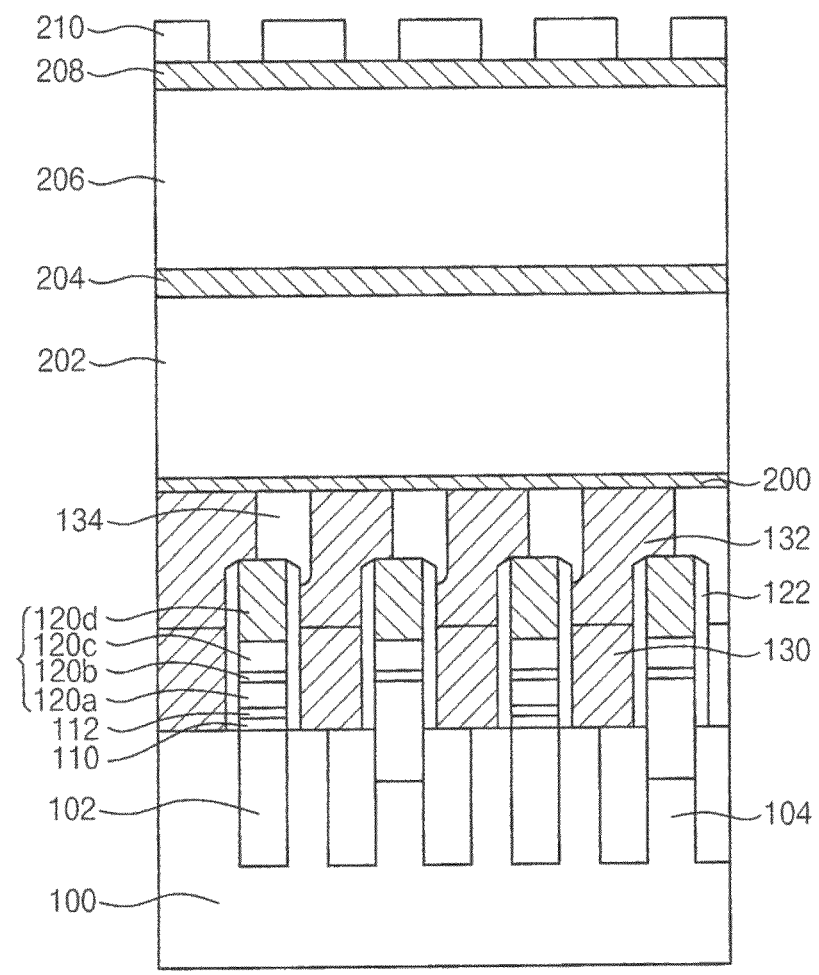

Referring to FIG. 12, a second etch stop layer 200 may be formed on the first insulating interlayer, the landing pad 132, and the insulation pattern 134. The second etch stop layer 200 may include, e.g., silicon nitride, silicon oxynitride, or the like.

A lower mold layer 202, a lower support layer 204, an upper mold layer 206, and an upper support layer 208 may be sequentially stacked on the second etch stop layer 200. The lower mold layer 202 and the upper mold layer 206 may include a material having an etch selectivity respect to the lower support layer 204 and the upper support layer 208. For example, the lower mold layer 202 and the upper mold layer 206 may include silicon oxide, and the lower support layer 204 and the upper support layer 208 may include silicon nitride.

A capacitor mask pattern 210 may be formed on the upper support layer 208. The capacitor mask pattern 210 may include holes exposing portions for forming lower electrodes. The holes may be arranged in a honeycomb structure. The capacitor mask pattern 210 may include amorphous carbon or polysilicon.

Figure 13:
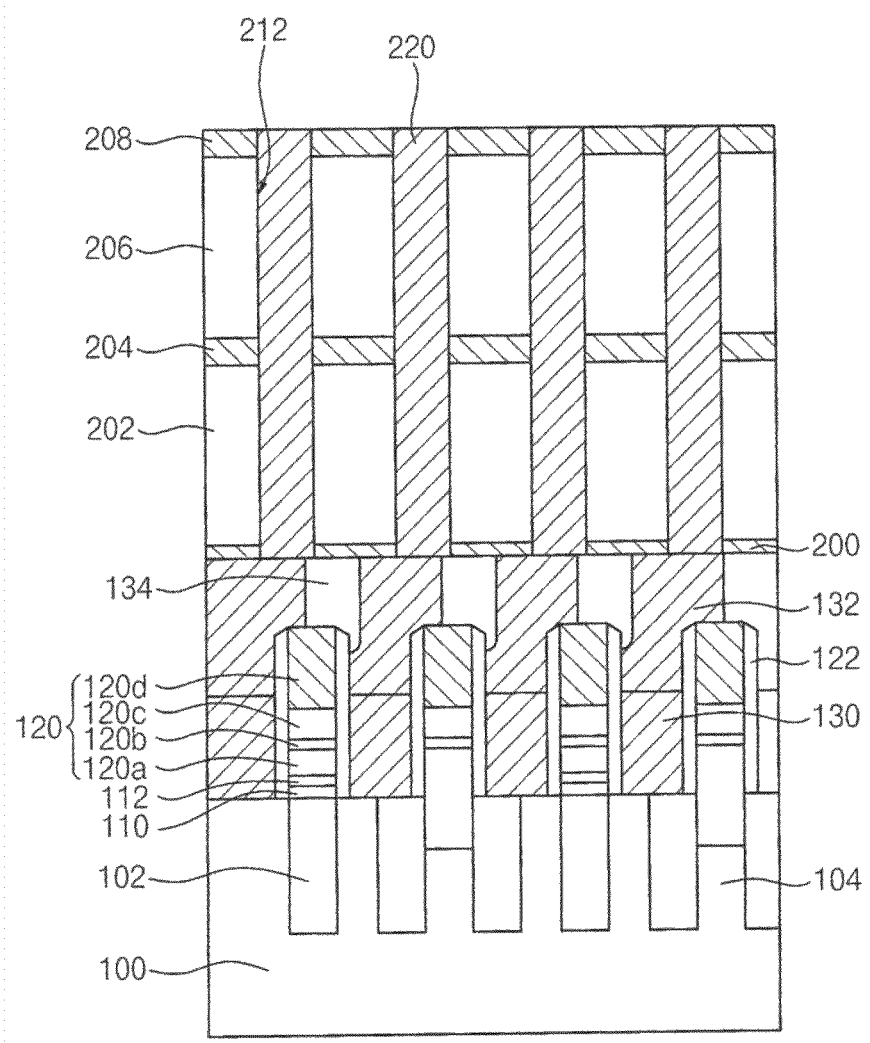

Referring to FIG. 13, the upper support layer 208, the upper mold layer 206, the lower support layer 204, the lower mold layer 202, and the second etch stop layer 200 may be etched using the capacitor mask pattern 210 as an etch mask to form first holes 212. The etching process may include an anisotropic etching process. The first holes 212 may expose upper surfaces of the landing pads 132, respectively.

Thereafter, a lower electrode layer may be formed to fill the first holes 212. The lower electrode layer may be planarized until an upper surface of the upper support layer 208 may be exposed to form lower electrodes 220. The lower electrodes 220 may be formed in the first holes 212. The lower electrode layer may include a metal such as Ti, W, Ni, and/or Co or a metal nitride such as TiN, TiSiN, TiAlN, TaN, TaSiN, and/or WN.

Figure 14:
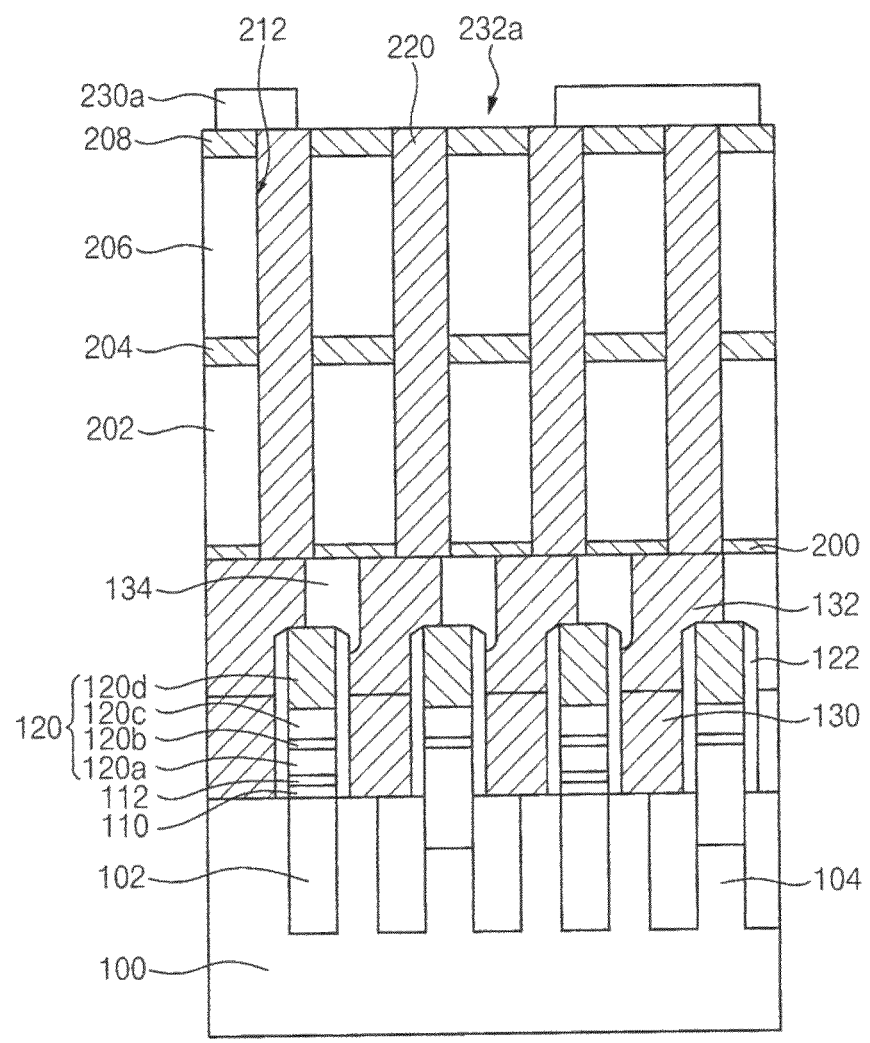

Referring to FIG. 14, a first mask layer may be formed on the upper support layer 208 and the lower electrode 220. The first mask layer may include amorphous carbon or polysilicon.

The first mask layer may be patterned by an exposure process using a photomask to form a first mask pattern 230a. The first mask pattern 230a may serve as a mask for forming the first upper support layer pattern.

The first mask pattern 230a may include first mask holes 232a, and the first mask holes 232a may be positioned at the same positions of first openings included in the first upper support layer pattern. The positions of the first mask holes 232a may be different depending on a shape of the first upper support layer pattern.

Figure 15:
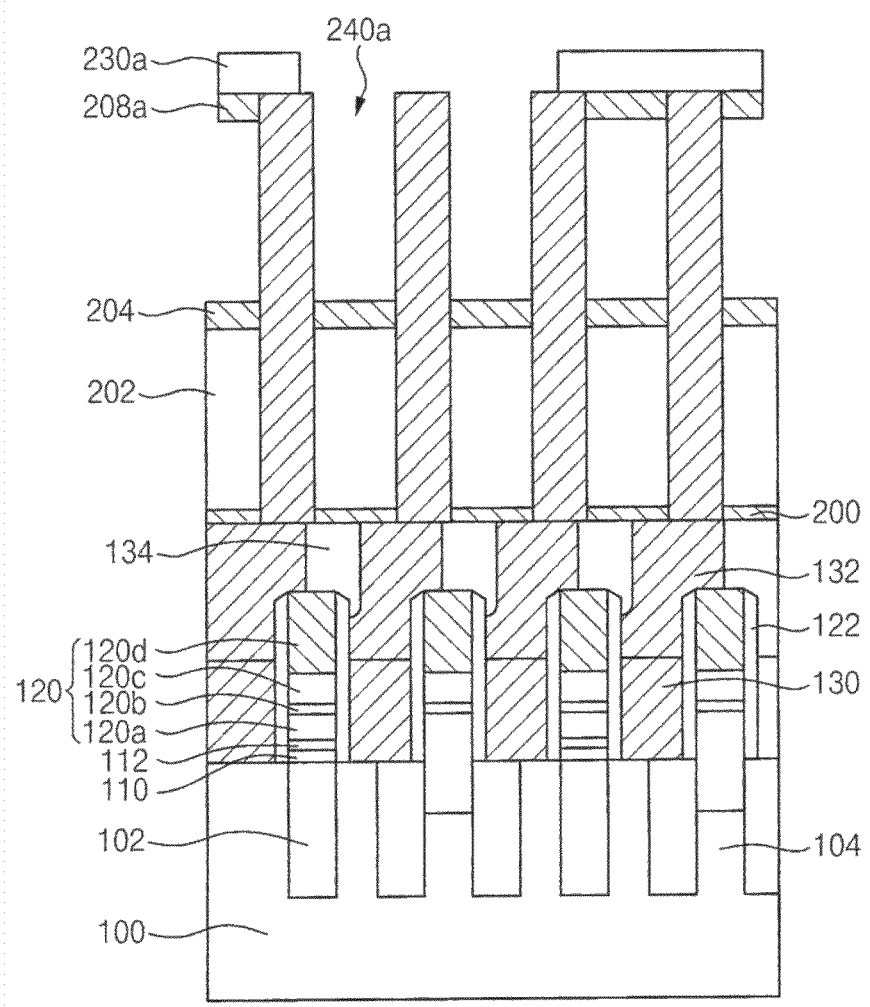

Referring to FIG. 15, the upper support layer 208 may be etched using the first mask pattern 230a to form a first upper support layer pattern 208a. The etching process may include an anisotropic etching process, for example, a dry etching process.

In the etching process, the lower electrode 220 may be hardly etched. In another example, although not shown, an exposed upper portion of the lower electrode 220 may be partially etched.

The first upper support layer pattern 208a may include the first openings 240a.

The upper mold layer 206 may be removed. The removal process may include an isotropic etching process, for example, a wet etching process. When the upper mold layer 206 includes silicon oxide, the etching process may be performed using an etchant including HF, NH4F, or the like.

In example embodiments, the first upper support layer pattern 208a may have the same shape as that illustrated with reference to FIG. 3. In some example embodiments, the first upper support layer pattern 208a may have the same shape as any one of those shown in FIGS. 6 to 10.

Figure 16:
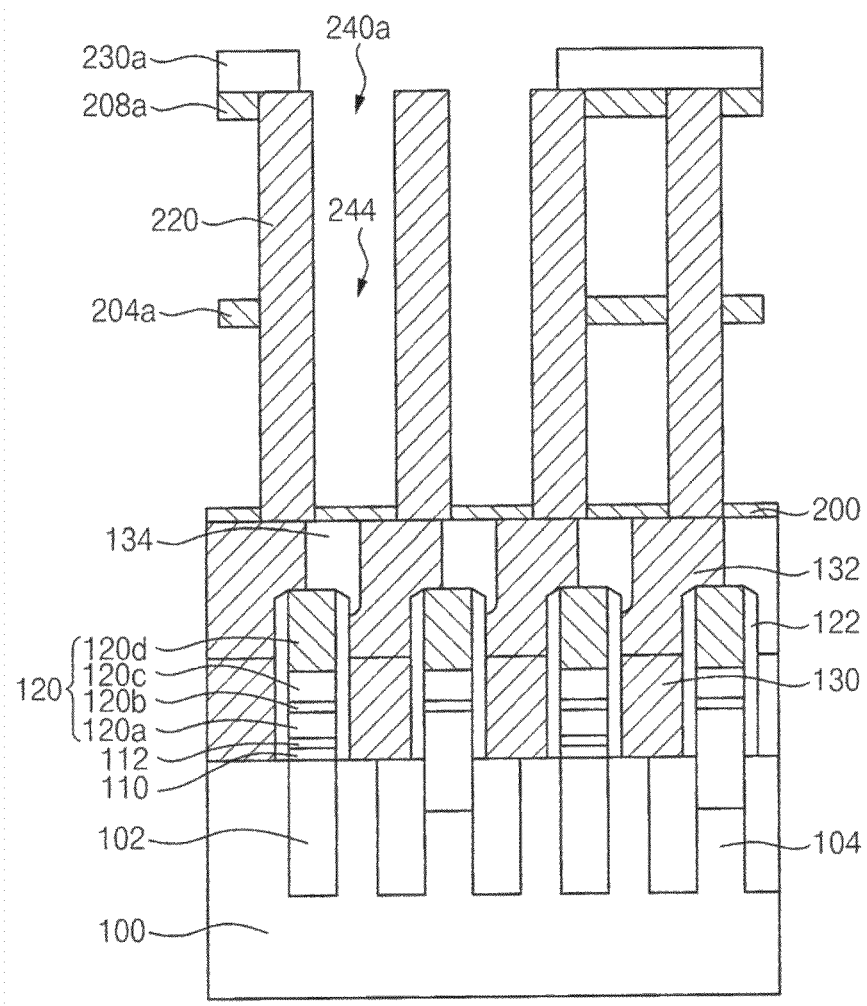

Referring to FIG. 16, the lower support layer 204 may be etched using the first mask pattern 230a to form a first lower support layer pattern 204a. The etching process may include an anisotropic etching process, for example, a dry etching process.

The first lower support layer pattern 204a may have substantially the same shape as the first upper support layer pattern 208a. The first lower support layer pattern 204a may include second openings 244. The second openings 244 may be positioned at the same positions as the first openings 240a.

The lower mold layer 202 may be removed. The removal process may include an isotropic etching process, for example, a wet etching process. When the lower mold layer 202 may include silicon oxide, the etching process may be performed using an etchant containing HF, NH4F, or the like.

The first mask pattern 230a may be removed.

By performing the above process, the first lower support layer pattern 204a and the first upper support layer pattern 208a for supporting the lower electrode 220 may be formed.

Positions of the first and second openings 240a and 244 may be controlled so that bending stresses may not be generated in a direction in which the two neighboring lower electrodes 220 face each other. Thus, the bending stresses applied to the lower electrodes 220 may be decreased by the first lower support layer pattern 204a and the first upper support layer pattern 208a.

Figure 17:
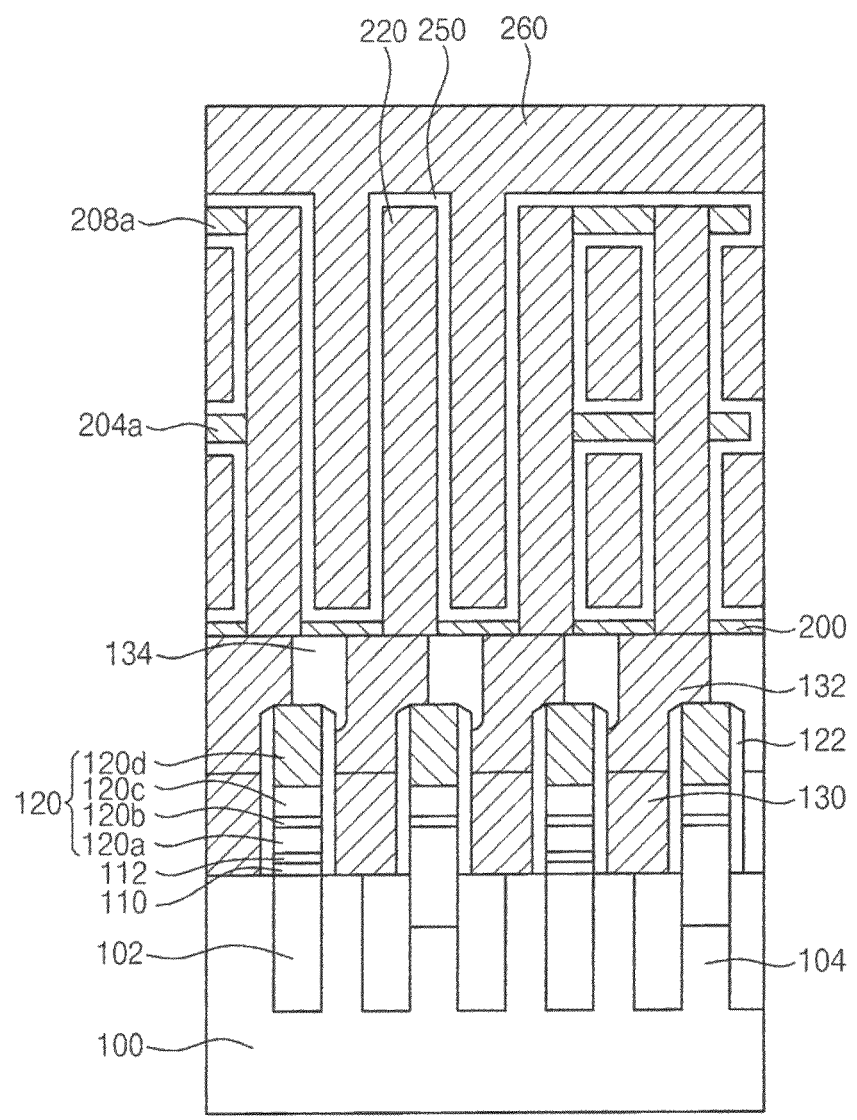

Referring to FIG. 17, a dielectric layer 250 may be conformally formed on surfaces of the second etch stop layer 200, the lower electrode 220, the first lower support layer pattern 204a, and the first upper support layer pattern 208a.

The dielectric layer 250 may be formed of a metal oxide such as HfO2, ZrO2, Al2O3, La2O3, Ta2O3 and TiO2, a perovskite dielectric material such as SrTiO3 (STO), BaTiO3, PZT, PLZT, or combinations thereof. The dielectric layer 250 may be formed by a CVD process or an ALD process.

An upper electrode 260 may be formed to cover the dielectric layer 250. The upper electrode 260 may include TiN. The upper electrode 260 may be formed by a CVD process or an ALD process.

The upper electrode 260 may fill a space between the lower electrodes 220 and a space between the first lower support layer pattern 204a and the first upper support layer pattern 208a.

A DRAM device may be manufactured by the above process. In the DRAM device, the support layer pattern of the cell capacitor may be formed so that the bending stress may not be generated in the direction in which neighboring lower electrodes face each other. Thus, bridge defects of the lower electrodes due to bending stress of the lower electrodes may be decreased.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   lower electrodes on a substrate, the lower electrodes in a honeycomb pattern such that the lower electrodes are at each vertex of a hexagon and a center of the hexagon;
   a first upper support layer pattern on upper sidewalls of the lower electrodes, the first upper support layer pattern between the lower electrodes, the first upper support layer pattern being a first plate shape including openings exposing a portion of all the lower electrodes; and
   a dielectric layer and an upper electrode on surfaces of the lower electrodes and the first upper support layer pattern;
   wherein the lower electrodes form rows in a first direction, and the rows are arranged in a second direction perpendicular to the first direction, and
   wherein each of the openings exposes portions of upper sidewalls of at least four lower electrodes in two adjacent rows in the second direction, and in a plan view, each of the openings has a longitudinal direction in the first direction.

2. The semiconductor device of claim 1, wherein neighboring openings are not arranged in parallel in the first direction, and neighboring openings are arranged in parallel in the second direction.

3. The semiconductor device of claim 1, wherein each of the openings has an elliptical shape, in a plan view.

4. The semiconductor device of claim 1, wherein each of the openings has a rectangular shape, in a plan view.

5. The semiconductor device of claim 1, wherein each of the openings has a trapezoidal shape, in a plan view.

6. The semiconductor device of claim 1, further comprising a first lower support layer pattern connecting sidewalls of center portions of the lower electrodes, the first lower support layer pattern being between the lower electrodes, and the first lower support layer pattern having a shape the same as a shape of the first upper support layer pattern.

7. The semiconductor device of claim 1, wherein a direction of a bending stress applied to each of the lower electrodes is not parallel with an imaginary boundary of an open portion at an overlapping portion of each of the lower electrodes and a respective one of the openings, and the openings are such that directions of the bending stresses of neighboring lower electrodes do not face each other.

8. A semiconductor device, comprising:
   a cell lower structure on a substrate, the cell lower structure including bit line structures, contact plugs and landing pads;
   lower electrodes on the landing pads, respectively, the lower electrodes in a honeycomb pattern such that the lower electrodes are at each vertex of a hexagon and a center of the hexagon;
   a first upper support layer pattern on upper sidewalls of the lower electrodes, the first upper support layer pattern between the lower electrodes, the first upper support layer pattern having a first plate shape including openings exposing a portion of all the lower electrodes; and
   a dielectric layer and an upper electrode on surfaces of the lower electrodes and the first upper support layer pattern,
   wherein the lower electrodes form rows in a first direction, and the rows are arranged in a second direction perpendicular to the first direction,
   wherein each of the openings exposes portions of upper sidewalls of at least four lower electrodes in two adjacent rows in the second direction, and
   wherein a direction of a bending stress applied to each of the lower electrodes is not parallel with an imaginary boundary of an open portion at an overlapping portion of each of the lower electrodes and a resective one of the openings, and the openings are such that directions of the bending stresses of neighboring lower electrodes do not face each other.

9. The semiconductor device of claim 8, wherein neighboring openings are not arranged in parallel in the first direction, and the neighboring openings are arranged in parallel in the second direction.

10. The semiconductor device of claim 8, wherein, in a plan view, at least one of the openings partially exposes n (n is 3 or more) lower electrodes in a first row and n−1 lower electrodes in a second row adjacent to the first row, and the directions of bending stresses of the lower electrodes in the second row exposed by the opening are parallel to the second direction.

11. The semiconductor device of claim 10, the directions of bending stresses of some of the lower electrodes in the first row exposed by the opening are parallel to the second direction, and the directions of bending stresses of other of the lower electrodes in the first row exposed by the openings are different from the second direction.

12. The semiconductor device of claim 11, wherein the directions of the bending stresses of the lower electrodes positioned at both ends among the lower electrodes in the first row exposed by the openings are different from the second direction.

13. The semiconductor device of claim 8, wherein in a plan view, at least one of the openings partially exposes the same number of lower electrodes in a first row and a second row adjacent to the first row, and directions of bending stresses of one of the lower electrodes in the first row and one of the lower electrodes in the second row exposed by the openings are different from the second direction.

14. The semiconductor device of claim 13, wherein the directions of the bending stresses of some of the lower electrodes in the first row and the second row exposed by the openings are parallel to the second direction.

15. The semiconductor device of claim 8, wherein each of the openings has an elliptical shape, in a plan view.

16. The semiconductor device of claim 8, wherein each of the openings has a rectangular shape, in a plan view.

17. The semiconductor device of claim 8, wherein each of the openings has a trapezoidal shape, in a plan view.

18. The semiconductor device of claim 8, further comprising a first lower support layer pattern connecting sidewalls of center portions of the lower electrodes, the first lower support layer pattern being between the lower electrodes, and the first lower support layer pattern having a shape the same as a shape of the first upper support layer pattern.

19. A semiconductor device, comprising:
a cell lower structure on a substrate, the cell lower structure including bit line structures, contact plugs and landing pads;
lower electrodes on the landing pads, respectively the lower electrodes being in a honeycomb pattern such that the lower electrodes are arranged at each vertex of a hexagon and a center of the hexagon;
a first upper support layer pattern on upper sidewalls of the lower electrodes, the first upper support layer pattern between the lower electrodes, the first upper support layer pattern having a first plate shape including openings exposing a portion of all the lower electrodes; and
a dielectric layer and an upper electrode on surfaces of the lower electrodes and the first upper support layer pattern,
wherein the lower electrodes form rows in a first direction, and the rows are arranged in a second direction perpendicular to the first direction,
wherein each of the openings exposes portions of upper sidewalls of at least four lower electrodes in two adjacent rows in the second direction, and in a plan view, each of the openings has a longitudinal direction in the first direction, and
wherein neighboring openings are not arranged in parallel in the first direction, and the neighboring openings are arranged in parallel in the second direction.

20. The semiconductor device of claim 19, wherein a direction of a bending stress applied to each of the lower electrodes is not parallel with an imaginary boundary of an open portion at an overlapping portion of each of the lower electrodes and a respective one of the openings, and the openings are such that directions of the bending stresses of neighboring lower electrodes do not face each other.

* * * * *